US010157804B2

(12) United States Patent
Pforr

(10) Patent No.: US 10,157,804 B2
(45) Date of Patent: Dec. 18, 2018

(54) METHOD AND APPARATUS FOR DETERMINING A CRITICAL DIMENSION VARIATION OF A PHOTOLITHOGRAPHIC MASK

(75) Inventor: Rainer Pforr, Dresden (DE)

(73) Assignee: Carl Zeiss SMS Ltd., Misgav (IL)

(*) Notice: Subject to any disclaimer, the term of this patent is extended or adjusted under 35 U.S.C. 154(b) by 1097 days.

(21) Appl. No.: 14/232,097

(22) PCT Filed: Jul. 20, 2012

(86) PCT No.: PCT/EP2012/064249
§ 371 (c)(1),
(2), (4) Date: Mar. 3, 2014

(87) PCT Pub. No.: WO2013/011112
PCT Pub. Date: Jan. 24, 2013

(65) Prior Publication Data
US 2014/0236516 A1 Aug. 21, 2014

Related U.S. Application Data

(60) Provisional application No. 61/509,835, filed on Jul. 20, 2011.

(51) Int. Cl.
G03F 1/84 (2012.01)
G03F 7/20 (2006.01)
H01L 21/66 (2006.01)

(52) U.S. Cl.
CPC ............... *H01L 22/24* (2013.01); *G03F 1/84* (2013.01); *G03F 7/70625* (2013.01)

(58) Field of Classification Search
CPC ..... G03F 1/70; G03F 1/72; G03F 1/14; G03F 7/7025; G03F 1/84; G03F 7/70433;
(Continued)

(56) References Cited

U.S. PATENT DOCUMENTS 6,614,520 B1  9/2003  Bareket et al.
6,794,302 B1*  9/2004  Chen ................. H01J 37/32935
                                                216/59

(Continued)

FOREIGN PATENT DOCUMENTS

WO  WO09/007977  1/2009
WO  WO09/083606  7/2009

(Continued)

OTHER PUBLICATIONS

International Search Report for International Application No. PCT/EP2012/064249 dated Nov. 10, 2012 (3 pages).

(Continued)

*Primary Examiner* — Regis Betsch
*Assistant Examiner* — Kaleria Knox
(74) *Attorney, Agent, or Firm* — Fish & Richardson P.C.

(57) ABSTRACT

The invention relates to a method for determining a critical dimension variation of a photolithographic mask which comprises (a) using layout data of the photolithographic mask to determine at least two sub-areas of the photolithographic mask, each sub-area comprising a group of features, (b) measuring a distribution of a transmission of each sub-area, (c) determining a deviation of the transmission from a mean transmission value for each sub-area, (d) determining a constant specific for each sub-area, and (e) determining the critical dimension variation of the photolithographic mask by combining for each sub-area the deviation of the transmission and the sub-area specific constant.

24 Claims, 8 Drawing Sheets

Figure 1:
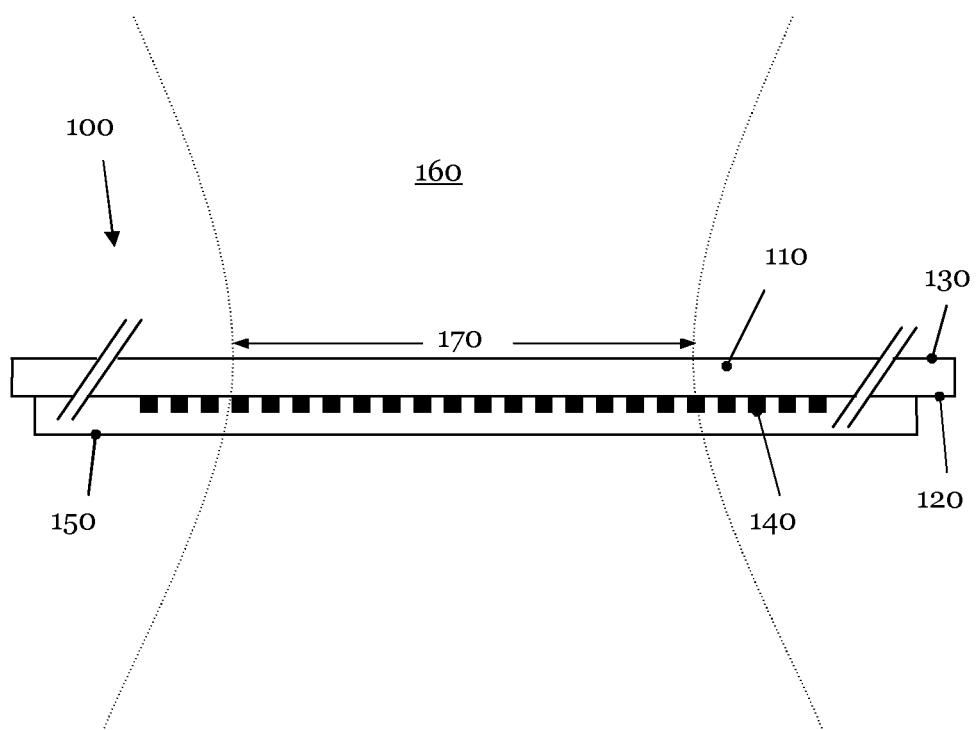

(58) Field of Classification Search
CPC .. G01B 26/02; G06F 17/5068; G01N 21/958; H01J 37/32935
USPC ............... 430/5, 30; 716/53, 51; 250/492.2, 250/358.1; 438/15; 216/59
See application file for complete search history.

(56) References Cited

U.S. PATENT DOCUMENTS

| | | | | |
|---|---|---|---|---|
| 7,644,389 | B2* | 1/2010 | Hennig | G03F 1/14 430/30 |
| 9,207,530 | B2* | 12/2015 | Dmitriev | G03F 1/84 |
| 2002/0041369 | A1* | 4/2002 | Boettiger | G02B 26/02 250/492.2 |
| 2003/0059688 | A1* | 3/2003 | Inomata | G03F 1/14 430/5 |
| 2004/0259005 | A1* | 12/2004 | Nakano | G03F 7/70433 430/5 |
| 2005/0246675 | A1* | 11/2005 | Scheffer | G06F 17/5068 716/51 |
| 2006/0215140 | A1* | 9/2006 | Dirksen | G03F 7/7025 355/69 |
| 2008/0243730 | A1* | 10/2008 | Bischoff | G03F 7/70625 706/12 |
| 2008/0286887 | A1* | 11/2008 | Goo | G06F 17/5036 438/15 |
| 2011/0101226 | A1* | 5/2011 | Ben-Zvi | G01N 21/958 250/358.1 |
| 2012/0005634 | A1* | 1/2012 | Seltmann | G03F 1/70 716/53 |
| 2012/0009511 | A1* | 1/2012 | Dmitriev | G03F 1/72 430/5 |

FOREIGN PATENT DOCUMENTS

| | | |
|---|---|---|
| WO | WO11/104613 | 9/2011 |
| WO | WO12/046233 | 4/2012 |

OTHER PUBLICATIONS

Gek Soon Chua et al., "Intra Field CD Uniformity Correction by Scanner Dose Mapper™ using Galileo® Mask Transmission Mapping as the CDU Data Source", *Proc. of SPIE*, vol. 7640, pp. 76402U-1-76402U-11 (2010).

Koen van Ingen Schenau et al., "Scatterometry based 65nm node CDU analysis and prediction using novel reticle measurement technique", *Proc. of SPIE*, vol. 5752, pp. 1312-1322 (2005).

KangJoon Seo et al., "New Critical Dimension Uniformity measurement concept based Reticle Inspection Tool", *Proc. of SPIE*, vol. 7748, pp. 77480N-1-77480N-8 (2010).

Korean Office Action for Korean Application No. 10-2014-7004302 dated Jun. 28, 2018.

* cited by examiner

METHOD AND APPARATUS FOR DETERMINING A CRITICAL DIMENSION VARIATION OF A PHOTOLITHOGRAPHIC MASK

CROSS-REFERENCE TO RELATED APPLICATIONS

This application is a 371 U.S. National Stage Application of PCT/EP2012/064249, filed on Jul. 20, 2012, which claims priority to U.S. provisional patent application 61/509,835, filed on Jul. 20, 2011. The contents of the above applications are herein incorporated by reference in their entirety.

1. FIELD OF THE INVENTION

The present invention relates to the field of determining a critical dimension variation of a photolithographic mask.

2. BACKGROUND OF THE INVENTION

As a result of the shrinking sizes of integrated circuits, photolithographic masks have to project smaller and smaller structures onto a photosensitive layer i.e. a photoresist dispensed on a wafer. In order to fulfill the decrease of the critical dimension (CD) of the structure elements forming the integrated circuits (ICs), the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex, and thus more and more expensive as well. In the future, photolithographic masks will use significantly smaller wavelengths in the extreme ultraviolet (EUV) wavelength range of the electromagnetic spectrum (approximately 13.5 nm).

The shrinkage of the CD for smaller actinic wavelengths requires a respective reduction of the critical dimension variation, i.e., the critical dimension uniformity (CDU) across the mask. The distribution of the CD across the mask area is directly linked with a variation of critical IC parameters fabricated within the illumination field of the mask at various positions on the wafer. Thus, an increase in the variation of the critical dimension may immediately lead to a yield reduction of the fabricated ICs.

Therefore, in addition to the CD, the variation of the CD or the CD uniformity (CDU) is a key characteristic of a photolithographic mask. It is therefore very important to know the distribution of CD across a photolithographic mask. In case the CDU of a produced mask does not fulfill a predetermined specification, the CD variation can be reduced in a CD correction process as explained in the applications U.S. provisional patent application 61/351,056 and U.S. provisional patent application 61/363,352 of the applicant which are incorporated herein by reference in their entirety.

Since some time, it has been detected that the CDU may deteriorate during the operation of the photolithographic mask in an illumination system. PCT application WO 2009/007977 A2 of the applicant and the U.S. Pat. No. 6,614,520 B1 describe that photomasks may degrade during the operation even if they have been free of defects at the beginning of their operation lifetime and disclose methods for monitoring this process. Furthermore, for example, the article "Detection of Progressive Transmission Loss Due to Haze with Galileo™ Mask DUV Transmittance Mapping Based on Non Imaging Optics" of S. Labovitz et al., BACUS Symposium on Photomask Technology, Vol. 7122 (2), 7-10 Oct. 2008, Monterey, Calif., USA, 2008, describes various causes for a broadening of the CD distribution during operation of the mask in the factory. Consequently, it is necessary to regularly control the CDU behaviour across the mask in order to detect the occurrence of a CD variation relevant defect as soon as possible, and thus avoiding yield problems for the fabricated ICs.

As an example, for the 45 nm technology node, the CD on the wafer amounts to 45 nm and the allowed CDU across the wafer are 4.7 nm for memory elements and 1.9 nm for logic ($3\sigma$). This requires a resolution in the determination of the CDU below 1 nm. Available tools which can spatially resolve structures of pattern elements in the sub-nanometer range include, for example, a scanning electron microscope (SEM) and an atomic force microscope (AFM).

However, the application of these tools is restricted to the investigation of a small number of specific mask positions as the alignment and the scan of a SEM, and/or of an AFM across the defective portion is a time-consuming process. Moreover, the application of a SEM or of an AFM for CD measurements requires the removal of the pellicle from the mask which introduces an uncertainty in the CDU determination as the influence of the re-mounting of the pellicle is ignored. Additionally, high energy electrons of the SEM may deteriorate the performance of the mask. Thus, these tools may be used for test and calibration purposes, but they are not suited for mapping the CD variation across a complete photolithographic mask.

The paper "In-field CD uniformity control by altering transmission distribution of the photomask, using ultra-fast pulsed laser technology" by Y. Morikawa et al., Photomask and Next-Generation Lithography Mask Technology XIII, Ed.: M. Hoga, Proc. Vol. 6283, May 20, 2006, describes that a variation of the optical transmission within a mask results in a proportional variation of the CD. A variation of the optical transmission or of the exposure dose change of 1% results in a CD variation of 1 to 2 nm depending on the exposure and the process conditions. Thus, optical metrology tools have to have an optical transmission resolution limit of less than 0.5% to provide the resolution required to measure the CD distribution across a photolithographic mask.

Optical measurements of the CD distribution or CD variation by analyzing the variation of the optical transmission using imaging optics are limited in their resolution. Using an imaging camera detection system (e.g., charge-coupled device (CCD camera), the CCD noise on the one hand and the limited dynamic range of a CCD camera on the other hand restrict the detection of a local optical transmission variation to an optical intensity change of about 1%. This interrelationship is for example reported in the article "Very High Sensitivity Mask DUV Transmittance Mapping and Measurement Based on Non Imaging Optics" by G. Ben-Zvi et al., Proc. 24$^{th}$ European Mask and Lithography Conference, Jan. 21-24, 2008.

Thus, optical metrology tools having an imaging optic and using the aerial image in the wafer plane requires some averaging of each image in order to reach the necessary resolution. As a consequence, the measurement of the optical transmission of the overall mask area with an imaging tool can be a time-consuming process. More importantly, critical dimension scanning electron microscope (CD SEM) measurements are necessary in order to determine the proportionality constant between transmission variation and CD variation at selected positions across the photomask.

Since some years ago, an optical inspection tool called Galileo™ is available that allows scanning the overall area of a photolithographic mask within a reasonable time period (cf. e.g. "Very High Sensitivity Mask DUV Transmittance Mapping and Measurements Based on Non Imaging Optics" of G. Ben-Zvi et al., Proc. 24$^{th}$ European Mask and Lithography Conference, Jan. 21-24, 2008). This tool uses a non-imaging optics which compromise image fidelity by allowing all scrambled angles of illumination to pass through the mask and to be detected by the detection system. With a proper non imaging optical design a large gain in optical transmission from the source to the detector can be realized, which leads to significant improvements of the signal-to-noise ratio (SNR) and thus leads to a significant reduction of the measurement time. The non-imaging metrology tool uses a broad band DUV optical light source with a beam width or spot size in the range of 0.1 mm to 5.5 mm and a fast photo detector, such as for example a photodiode or a photomultiplier tube. It can resolve optical transmission changes of less than 0.05%. By needing less than one second per measurement position, this tool allows scanning of the active area of a mask in less than one hour. The pellicle does not need to be removed for the measurement.

PCT application WO 2009/083606 A1 of the applicant describes the determination of the CDU on a mask by measuring the DUV transmission across the photolithographic mask with the non-imaging metrology tool described above. PCT application WO 2009/083606 A1 proposes to determine the proportionality constant between transmission variation and CD variation either from a linear regression of the CD variation obtained from an aerial image, from CD SEM calibration measurements, from IC manufacturing data, or from data stored in a central data base. This data is adapted to the specific photolithographic mask by calculating an individual proportionality constant for each measurement position.

The method disclosed in WO 2009/083606 A1 has some drawbacks. It requires a specific non-imaging tool in addition to the already available imaging metrology tools. Further, some effort is necessary to establish a CDU map for the photomask from the measurement of the transmission distribution caused by the determination of the proportionality constant between optical transmission variation and CD variation. The identification of the constant may comprise CD SEM and/or AFM measurements. Moreover, the CD variation determined with a non-imaging tool refers to the CD variation of the photomask. However, the more important quantity is the CD variation on the wafer which is affected the CD variation of the mask, the signature of the scanner and/or stepper used to scan the photomask across the wafer and the mask error enhancement factor (MEEF).

It is therefore one object of the present invention to provide a method and an apparatus for determining a critical dimension variation of a photolithographic mask, which at least partially removes the above mentioned drawbacks of the prior art.

3. SUMMARY OF THE INVENTION

According to a first aspect of the invention, a method for determining a critical dimension variation of a photolithographic mask is provided. The method comprises (a) using layout data of the photolithographic mask to determine at least two sub-areas of the photolithographic mask, each sub-area comprising a group of features, (b) measuring a distribution of a transmission of each sub-area, (c) determining a deviation of the transmission from a mean transmission value for each sub-area, (d) determining a constant specific for each sub-area, and (e) determining the critical dimension variation of the photolithographic mask by combining for each sub-area the deviation of the transmission and the sub-area specific constant.

The inventive method exploits that pattern of photolithographic masks typically have a regular structure. The layout data available for the mask manufacturer from the IC manufacturer is used as a single input source to identify islands in the active area of a mask called sub-areas which have a specific group of features. A state of the art verification or qualification tools can be used to determine the optical transmission within the sub-areas of the various feature groups. In a presently preferred embodiment, the above defined method does not need additional equipment. Moreover, the inventive method only measures the optical transmission of a portion of the mask; thus limiting the measurement time.

The determination of a sub-area specific constant for the sub-areas of each of the feature groups is based on an analysis of the layout data, and/or can be obtained from a simulation process using the layout data. The CD variation across the mask is obtained from the variation of the optical transmission within each sub-area and a sub-area specific sensitivity factor or proportionality constant.

The inventive method avoids the application of an SEM and/or of an AFM for the determination of the sub-area specific constants. Therefore, it is not necessary to prepare a mask sample for CD measurements with an SEM and/or AFM, for example by removing the pellicle.

Further, the defined method reduces the number of proportionality factors which have to be determined to the number of feature groups, which is typically less than 10. Moreover, using an aerial image at the position of the photomask for the determination of the optical transmission variations, the detected optical transmission data comprises all essential contributions for the CD variation on the wafer, i.e. the CD variation of the photomask including the pellicle, the signature of the scanner and/or stepper of the illumination system and the mask error enhancement factor (MEEF).

Therefore, the defined method provides fast and cost-effective process for analyzing the CDU across the mask. The inventive method is particularly suitable for a regular or irregular control of the CD development during the operation of the photolithographic mask in the illumination system. It can be applied to all types of reflective photomasks, as for example binary, optical proximity correction (OPC) and phase shift masks.

In a further aspect, correcting the determined critical dimension variation comprises locally modifying an optical density of the photolithographic mask substrate.

The optical density of the mask substrate is changed by locally writing arrangements of pixels in the mask substrate with femtosecond laser pulses. A critical dimension correction process following the CDU determination allows a reduction of the CD variation of a newly fabricated mask so that it fulfills a predetermined CDU specification. Consequently, the CD correction process following an inventive CDU determination increases the yield of a mask manufacturing process.

On the other hand, as already mentioned, the defined method can be applied to control the CDU evolution during operation. Further, it may be used to check the success of a cleaning process of the mask as well as of the pellicle.

Moreover, it can be utilized in order to detect the effect of the pellicle mounting process. These measures are suited to enlarge the operation lifetime of the photolithographic mask.

In another aspect, determining the sub-area of a feature group comprises searching for features in the layout data having a similar ratio of a total pattern circumference and a total pattern area, wherein the total pattern circumference is the sum of the circumferences of all pattern elements in a portion of the photolithographic mask and the total pattern area is the sum of all pattern elements in the portion of the photolithographic mask.

The ratio of the total area covered by pattern elements to the overall area of the feature group determines the mean optical transmission in the respective sub-area. The sensitivity of a transmission variation within a sub-area caused by a variation of the pattern element areas depends on the kind of the pattern elements in the respective sub-area. Therefore, the ratio of the circumference of a pattern element and its area is a suitable quantity to distinguish between various pattern elements available on a photolithographic mask.

The layout data is the single data source for identifying the sub-areas of identical or similar feature groups (FGs) across the active area of the mask. A computer program can analyze the layout data in order determine FG specific sub-areas by defining appropriate threshold levels for various total pattern circumference to total pattern area ratios.

According to another aspect, determining a distribution of the transmission of each sub-area comprises measuring the transmission at N grid nodes of each of M sub-areas. In still a further aspect, determining the deviation of the transmission from a mean transmission value comprises defining a mean transmission in the sub-area m according to:

$$T_{m,Mean} = \frac{1}{N} \cdot \sum_{i=1}^{N} T_m(x_i, y_i)$$

and a deviation from the mean transmission value $\Delta T_m(x_i,y_i)$ according to: $\Delta T_m(x_i,y_i)=T_m(x_i,y_i)-T_{m,Mean}$.

In the inventive method, the determination of the CD variation across the photolithographic mask is based on the optical transmission measurement statistics within the FG specific sub-areas. The CDU within a sub-area of a specific feature group is proportional to the deviation of the optical transmission from the mean transmission value within the respective sub-area.

In still a further aspect, determining the constant comprises analyzing of the layout data and/or performing a simulation process using the layout data.

The FG specific constant can be determined from the geometrical layout data provided by the IC manufacturer. A computer system is a suitable tool to perform this task. Alternatively, the FG specific constant can be identified by performing a simulation process based on the layout data. It is also conceivable to combine both kinds of analysis to improve the accuracy of the proportionality constant determination for the respective sub-area.

In another aspect, the simulation process comprises an aerial image simulation, in particular a two-dimensional aerial image simulation and/or a three dimensional aerial image simulation.

By using the layout data of the IC manufacturer an aerial image can be simulated which represents an ideal performance of the photolithographic mask as each pattern element is on its predetermined position and has its predetermined shape and area. An aerial image simulation calculates the path of a normalized energy flux through the photomask. Therefore, the aerial image simulation process emulates the optical transmission measurement of the aerial image at the position of the wafer.

A further aspect comprises applying a critical dimension variation offset $\Delta CD$ to all feature elements of the layout data and determining a normalized energy flux for the sub-area m $\Phi_{m,norm}$ for the feature elements having a target dimension $CD_{Target}$ and for the feature elements after applying the critical dimension variation offset $CD_{Target}+\Delta CD$ or $CD_{Target}-\Delta CD$ using the aerial image simulation. The critical dimension variation offset is the maximum allowed variation of the size of all feature elements so that a predetermined CDU requirement is still fulfilled.

Another aspect comprises determining the constant $C_m$ in the sub-area m as a quotient of the normalized energy flux variation $\Delta\Phi_{m,norm}$ and the critical dimension variation $\Delta CD$ according to:

$$C_m = \frac{\Delta\Phi_{m,norm}}{\Delta CD}$$

wherein the normalized energy flux variation is given by $$\Delta\Phi_{m,norm}=\Phi_{m,norm}(CD_{Target}+\Delta CD)-\Phi_{m,norm}(CD_{Target})$$

or $$\Delta\Phi_{m,norm}=\Phi_{m,norm}(CD_{Target})-\Phi_{m,norm}(CD_{Target}-\Delta CD).$$

In this example, the determination of the constant or of the proportionality factor is based on two aerial image simulations wherein the areas of the feature elements in a sub-area, which are taken from the layout data, are changed by a CD variation offset. In the simulation process, the photolithographic mask shows an ideal performance. Thus, the defined variation of the absorber covered sub-area results in a defined variation of the simulated normalized energy flux through the respective sub-area of the photolithographic mask. The simulations generate aerial images in two and/or three dimensions of the pattern elements contained in the respective FG sub-area of the mask. The aerial image data is analyzed in order to determine the variation of the normalized energy flux caused by the CD variation offset. The quotient of the normalized energy flux variation and the CD variation offset defines the FG specific constant.

According to another aspect, analysing the layout data comprises determining absorber covered areas for all pattern elements of the sub-area m, $F_{m,C}'$, and determining absorber covered areas $F_{m,C,+\Delta CD}'$ or $F_{m,C,-\Delta CD}'$ for all pattern elements after applying the critical dimension variation offset $CD_{Target}+\Delta CD$ or $CD_{Target}-\Delta CD$, and determining the variation of a normalized absorber covered area $\Delta F_{m,C}$ in the sub-area m according to:

$$\Delta F_{m,C} = \frac{F_{m,C,+\Delta CD}' - F_{m,C}'}{F_m'}, \text{ or } \Delta F_{m,C} = \frac{F_{m,C}' - F_{m,C,-\Delta CD}'}{F_m'}$$

wherein $F_m'$ is the overall sub-area m.

Still another aspect comprises determining the constant $C_m$ of the sub-area m as the quotient of the absorber covered normalized area variation $\Delta F_{m,C}$ and the variation the critical dimension variation $\Delta CD$ according to:

$$C_m = \frac{\Delta F_{m,C}}{\Delta CD}.$$

In this example, the determination of the proportionality constant between the variation of the optical transmission and the CD variation is based on an analysis of the geometrical layout data without performing an aerial image simulation. As already mentioned, this data is available from the IC manufacturer. The geometrical analysis of the layout data is straightforward and can be easily performed with the aid of a computer system.

According to a further aspect, analyzing the layout data comprises determining the total pattern circumference $TPC_m$ for all pattern elements in the sub-area m and determining the absorber covered area $F_{m,C}'$ for the sub-area m. A further aspect comprises determining the constant $C_m$ in the sub-area m as the quotient of the normalized absorber covered area $F_{m,C}$ and the total pattern circumference $TPC_m$ according to:

$$C_m = \frac{F_{m,C}}{TPC_m},$$

wherein the normalized absorber covered area $F_{m,C}$ of sub-area m is given by $$F_{m,C} = \frac{F'_{m,C}}{F'_m}.$$

In this example, the determination of the proportionality constant between the CD variation and the optical transmission variation is also based on the analysis of the geometrical layout data. This example analyses the ratio of the area change to the circumference change of a pattern element when its dimensions are varied by a CD variation offset.

In still a further aspect, determining the critical dimension variation $\Delta CD_m(x_i,y_i)$ in the sub-area m comprises forming a quotient of the deviation of the transmission $\Delta T_m(x_i,y_i)$ and of the constant $C_m$ according to:

$$\Delta CD_m(x_i, y_i) = \frac{\Delta T_m(x_i, y_i)}{C_m}.$$

The distribution of the CD variation across the photolithographic mask is given by the variation of the optical transmission measurement within each FG specific sub-area and a proportionality constant specific for the respective FG specific sub-area and which is determined according to one of the above mentioned examples. Therefore, the determination of the CD variation is based on optical transmission measurements and the analysis of layout data. A complex measurement (for example by using a SEM or an AFM) is not required for the identification of the FG specific proportionality constants.

A further aspect comprises determining a critical dimension variation across the photolithographic mask by interpolating the critical dimension variation for areas of the photolithographic mask not covered by sub-areas. Another aspect comprises determining a critical dimension variation across the photolithographic mask by extrapolating the critical dimension variation for areas of the photolithographic mask not covered by sub-areas.

The inventive principle assumes that the proportionality constant is constant for a specific FG, but changes its numerical value from one FG specific sub-area to another one. As already mentioned, the FG specific sub-areas are islands in or across the active area of the photomask. This means that portions of the active mask area may not be covered by a FG specific sub-area. The described method identifies the optical transmission variation of the portions of the active mask area covered with sub-areas. This results in a cost-effective way of the transmission measurement. On the other hand, the defined method only determines the sub-area specific constant and thus the CD variation of a portion of the active photomask area.

The CD variation of portions of the active mask area not covered by FGs can be determined by interpolating the CD variation determined for adjacent sub-areas. There is basically no restriction in the kind the interpolation is performed. The application of a linear gradient between the CD variations of the neighbouring sub-areas is a simple example of a CD variation interpolation.

At the boundary of the active mask area there may be portions of the active area not covered by FG specific sub-areas which do not have adjacent sub-areas. The CD variation of a specific sub-area can be extrapolated to a certain area around the area covered with pattern elements, so that the CD variation determined for specific FG specific sub-areas covers the overall active area. In this context "extrapolating" means also using the CD variation identified for a specific sub-area outside of this sub-area.

Moreover, in yet another aspect an apparatus for determining a critical dimension variation of a photolithographic mask comprises (a) a computer system operable to determine at least two sub-areas of the photolithographic mask from layout data, each sub-area comprising a group of features, to determine a deviation of a transmission from a mean transmission value for each sub-area, to determine a constant specific for each sub-area from the layout data, and to determine the critical dimension variation of the photolithographic mask by combining for each sub-area the deviation of the transmission and the sub-area specific constant and (b) a metrology tool comprising a source of electromagnetic radiation, a detector system for detecting the electromagnetic radiation of the source and optical means to direct the electromagnetic radiation from the source through the photolithographic mask to the detector system and operable to measure a distribution of the transmission of each sub-area.

Another aspect comprises a femtosecond laser system operable to locally modify an optical density of a photolithographic mask substrate in order to correct the determined critical dimension variation.

In a further aspect, the computer system is further operable to determine the sub-area of a feature group by searching for features in the layout data having a similar ratio of a total pattern circumference and a total pattern area, wherein the total pattern circumference is the sum of the circumferences of all pattern elements in a portion of the photolithographic mask and the total pattern area is the sum of all areas of all pattern elements in the portion of the photolithographic mask.

According to still a further aspect, the metrology tool is further operable to measure the transmission at N grid nodes of each of M sub-areas and the computer system is further operable to determine a distribution of the transmission of each sub-area.

In accordance with a further aspect, the computer system is further operable to perform a simulation process in order to determine the constant.

In yet another aspect, the simulation process comprises an aerial image simulation, in particular a two-dimensional aerial image simulation and/or a three dimensional aerial image simulation.

According to another aspect, the computer system is operable to analyze layout data in order to determine the constant.

4. DESCRIPTION OF THE DRAWINGS

In order to better understand the present invention and to appreciate its practical applications, the following Figures are provided and referenced hereafter. It should be noted that the Figures are given as examples only and in no way limit the scope of the invention.

Figure 2:
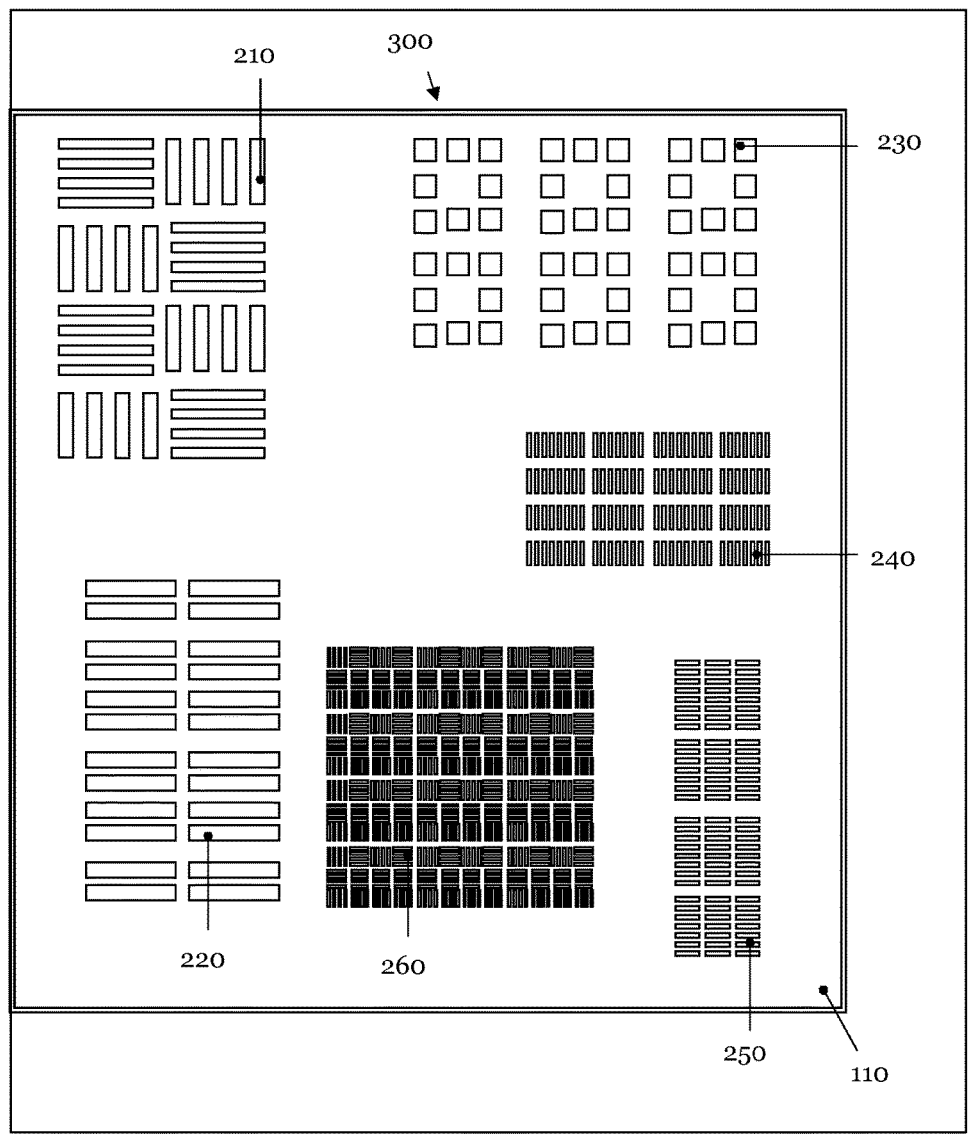
Figure 3:
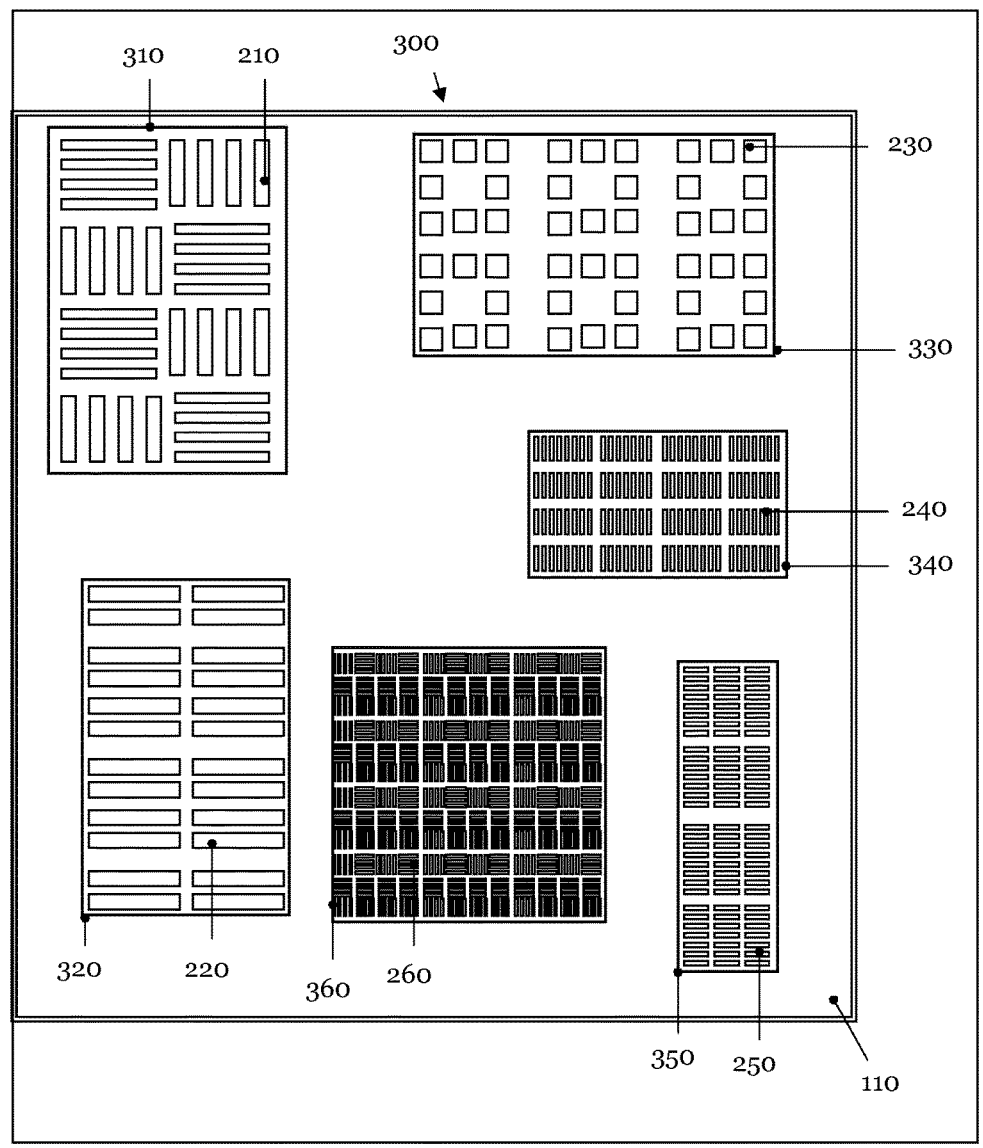
Figure 4:
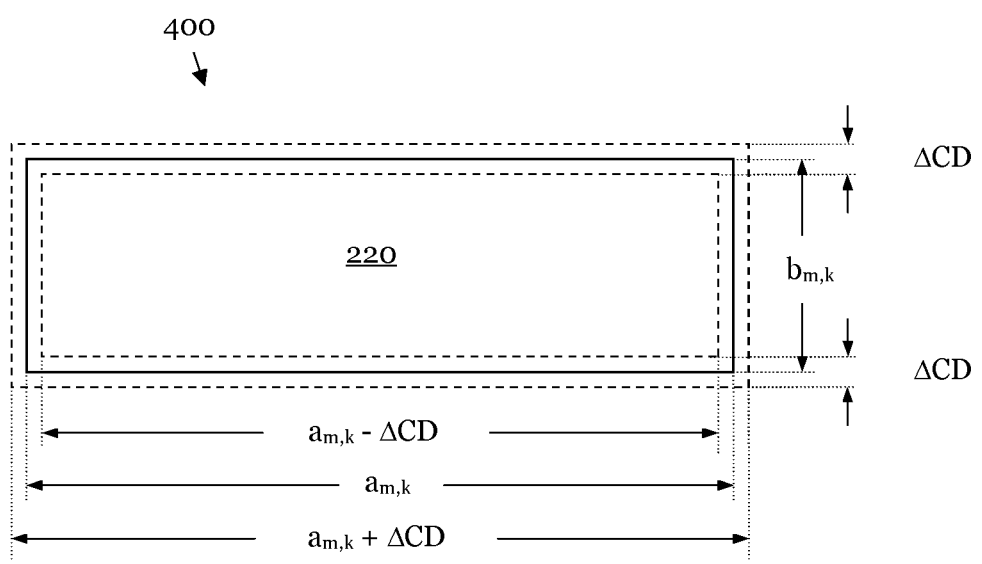
Figure 5:
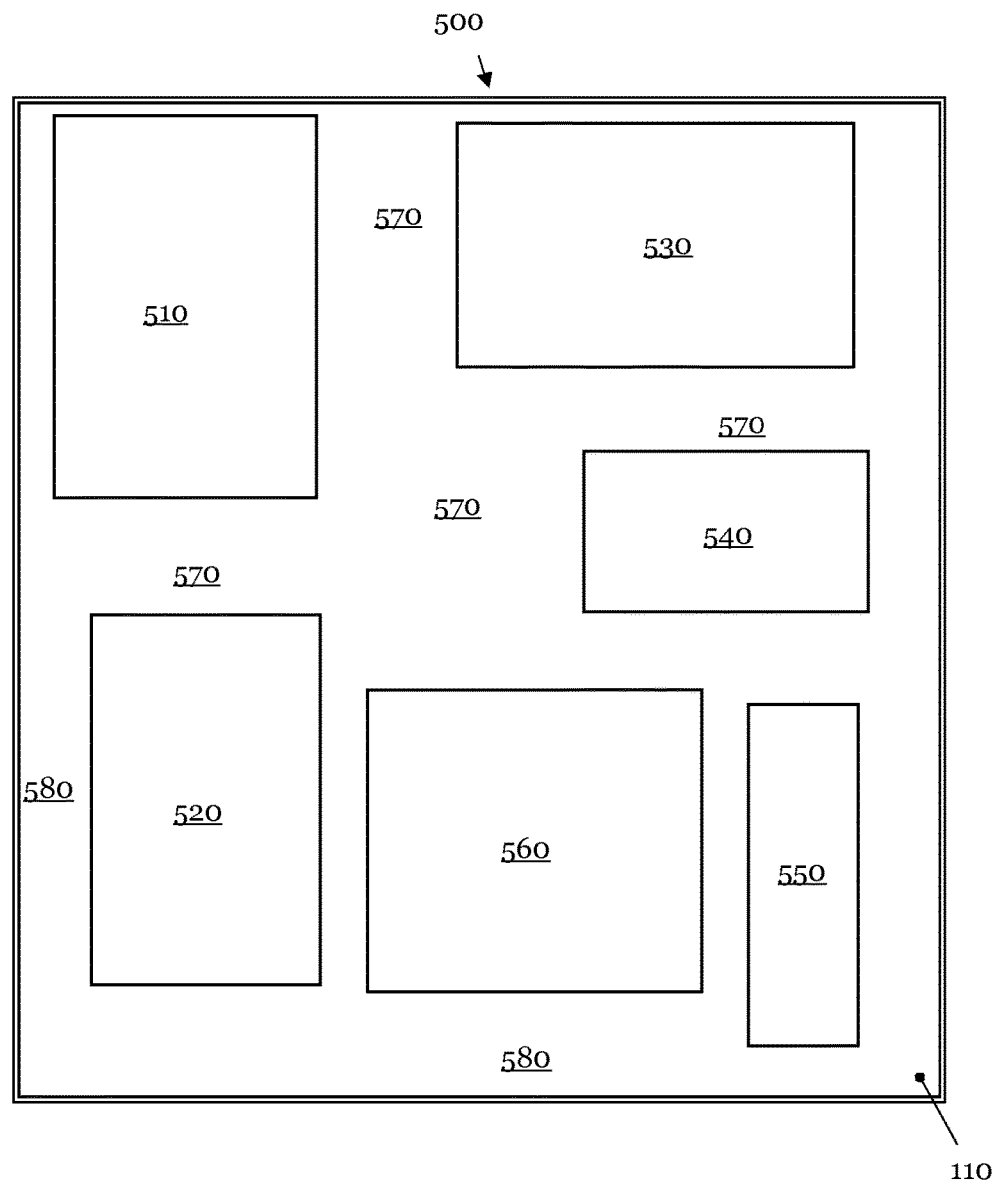
Figure 6:
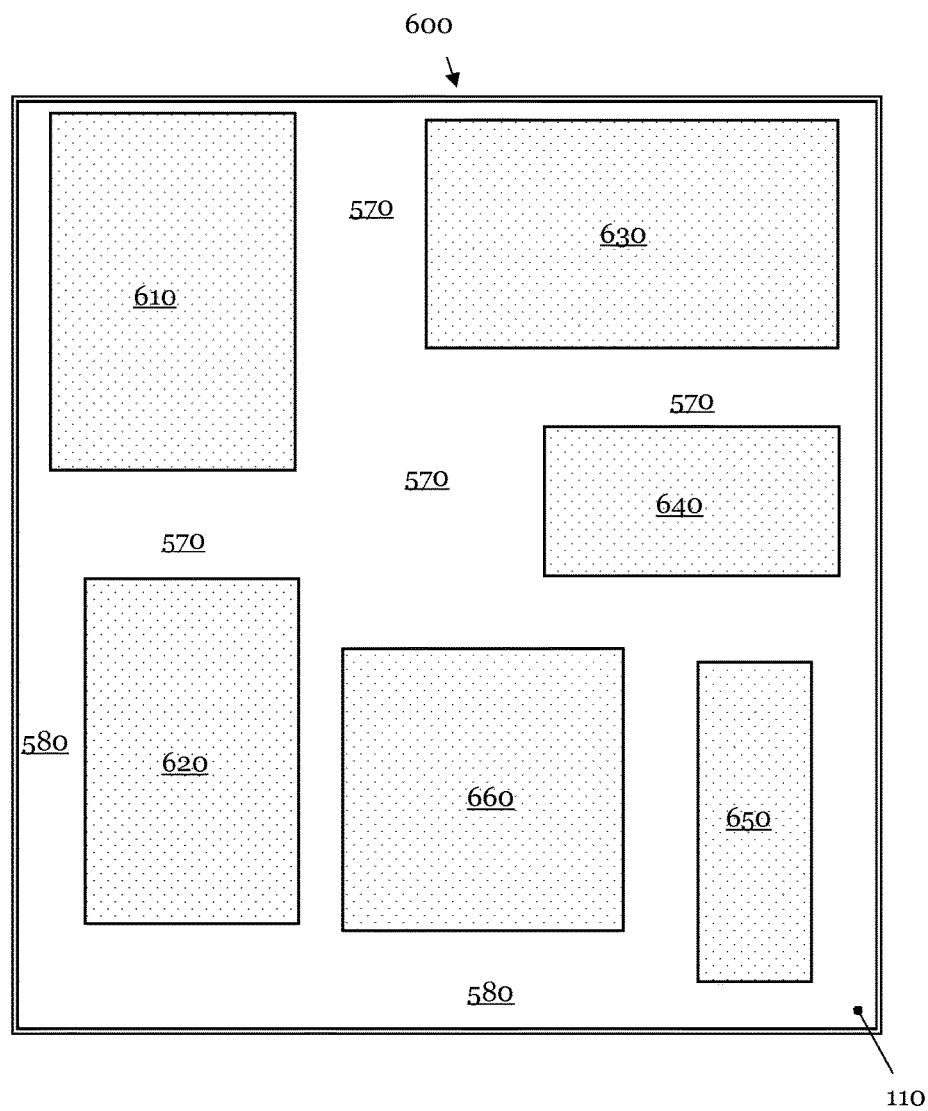
Figure 7:
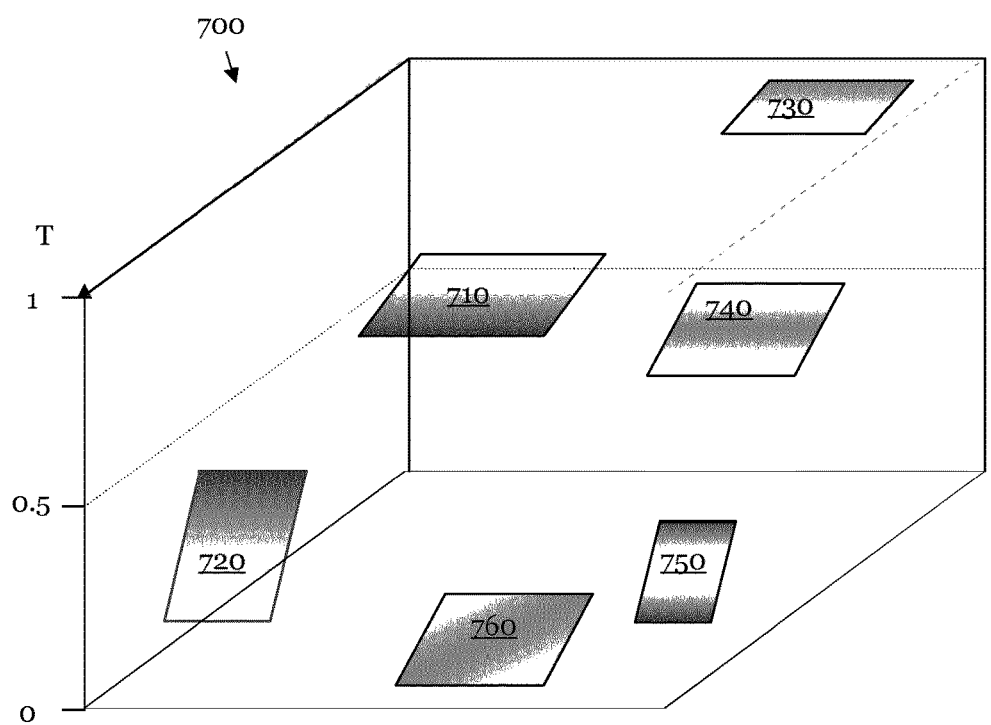
Figure 8:
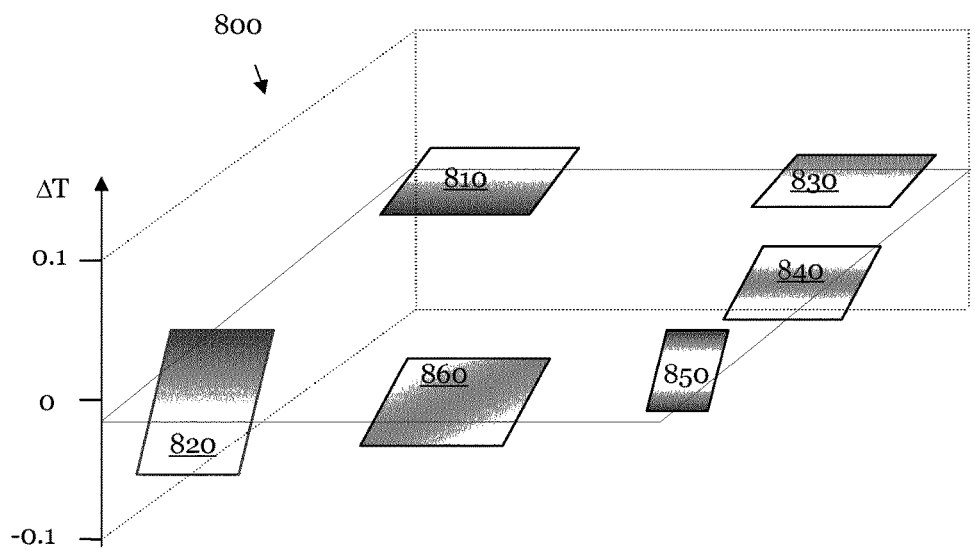
Figure 9:
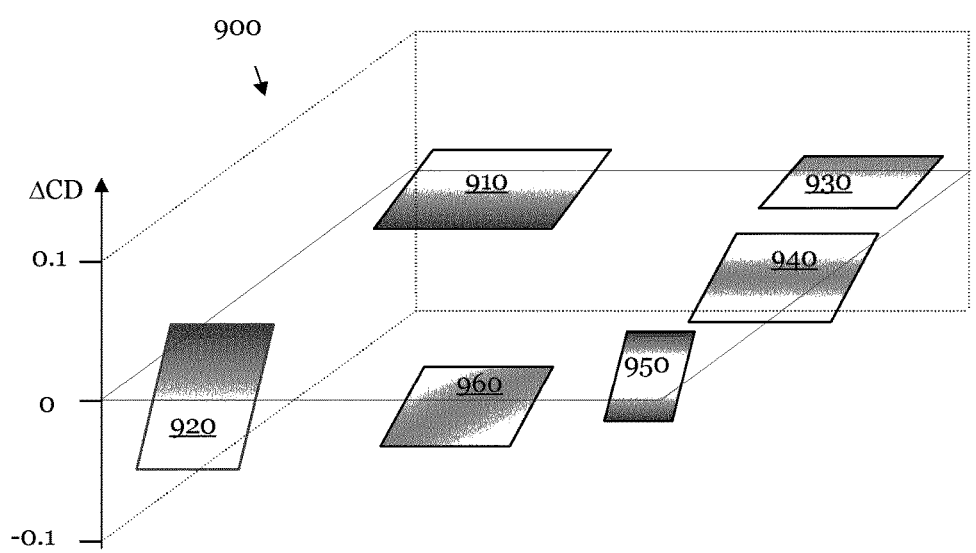

FIG. 1 schematically represents a cut-out of a photolithographic mask with an incident beam of a metrology tool to measure the optical transmission;

FIG. 2 schematically shows an arrangement of pattern elements in a photolithographic mask;

FIG. 3 schematically depicts the sub-area of the feature groups of the pattern elements of FIG. 2;

FIG. 4 schematically shows a single pattern element of FIG. 3 indicating a variation of its length and width by a critical dimension;

FIG. 5 schematically depicts the arrangement of sub-areas of the six feature groups of FIG. 3 without pattern elements;

FIG. 6 schematically shows the grid nodes of the sub-areas at which the optical transmission is measured;

FIG. 7 schematically represents optical transmission measurements of the sub-areas of the six feature groups of FIG. 5;

FIG. 8 schematically represents the transmission variation around the mean value of the transmission for the optical transmission measurements of FIG. 7; and FIG. 9 schematically illustrates the critical dimension variation determined from the transmission variation according to FIG. 8 and a feature group sub-area specific proportionality factor.

5. DETAILED DESCRIPTION OF PREFERRED EMBODIMENTS

In the following, the present invention will be more fully described with reference to the accompanying Figures, in which exemplary embodiments of the invention are illustrated. However, the present invention may be embodied in different forms and should not be construed as limited to the examples set forth herein. Rather, these examples are provided so that the disclosure will be thorough and will convey the scope of the invention to persons skilled in the art.

FIG. 1 schematically shows a cut-out of a photolithographic mask 110. The mask 110 comprises for example a fused silica substrate which is transparent in the deep ultraviolet (DUV) wavelength range. On its front surface 120 the mask 110 has in the depicted cross-section of the active area an arrangement of identical absorbing pattern elements 140. The absorber material may for example comprise chromium or tungsten. On the rear surface 130 the mask may have a thin coating layer of molybdenum/silicon (MoSi) or of another material or material composition (not indicated in FIG. 1). For the protection of the absorbing pattern elements 140, a pellicle 150 is mounted on the front surface 120 of the mask 110.

In the example depicted in FIG. 1, the metrology tool used for the measurement of the optical transmission is an aerial image measurement system (AIMS®). It measures the aerial image generated by the photomask 110 in the plane of the wafer (not indicated in FIG. 1). The light source of the preferred AIMS® system comprises a deep ultraviolet (DUV) light source which is for the 248 nm wavelength preferably Hg—Xe lamp, for the 193 nm wavelength preferably an ArF excimer laser. The optical system of the metrology tool in front of the photomask 110 is identical to the lithography system used for the illumination of the resist on a wafer. A scanner or a stepper (not shown in FIG. 1) is used to scan or step the beam 160 across the active mask area. Typical beam dimensions 170 of a scanner on the mask are 20 mm×30 mm. Thus, as schematically illustrated in the arrangement 100 of FIG. 1, the incident beam 160 is not imaging a single feature element 140, but simultaneously illuminates several or many pattern elements 140 depending on the dimensions of the pattern elements 140.

Instead of a demagnifying objective between mask and wafer using in the lithography system, the AIMS® metrology tool uses a magnifying objective which generates a larger scale image (typically in the range of 150×) of the portion of the active mask area illuminated by the light source of the AIMS® system at the position of the wafer. Preferably a charge coupled device (CCD) sensor arranged at the position of the wafer is used to detect the image of the photomask.

Instead of the imaging metrology system described above, it is also possible to use an non-imaging metrology tool in order to detect the variation of the optical transmission of the mask 110 caused by a variation of the pattern element areas arranged on the photomask front side. A non-imaging system uses a broad band DUV lamp which may comprise a wavelength range of 0.1 nm to 5.5 nm. The spot size 170 of the beam 160 of the DUV radiation source incident from the back surface 130 of the mask 110 has a width in the range of 0.2 mm to 5.5 mm. Thus, similar to the imaging AIMS® tool, the non-imaging tool also averages across several or many pattern elements 140 depending of the actual spot size 170 and the dimensions of the pattern elements 140. In contrast to the imaging metrology tool, the non-imaging tool only identifies the CD variation of the photomask 110.

The person skilled in the art will appreciate that the following diagrams are not true to scale, but are drawn to just illustrate the inventive principle.

FIG. 2 depicts a schematic top view on the photolithographic mask 110 of FIG. 1. On its front surface 120 the mask 110 has regular arrangements of pattern elements 210, 220, 230, 240, 250 and 260 on various portions of the mask active area. In the following, it is assumed that in general the mask 110 comprises M different portions wherein each portion has a specific arrangement of identical or similar pattern elements. In the specific example of FIG. 2 it is: M=6. A specific arrangement of pattern elements 210, 220, 230, 240, 250, 260 is in the following called a feature group (FG). The portion of the photolithographic mask 110 occupied by the pattern elements 210, 220, 230, 240, 250, 260 of a FG is named a sub-area.

FIG. 3 illustrates the sub-areas 310, 320, 330, 340, 350 and 360 of the FGs of the pattern elements 210 to 260 of FIG. 2. The number of feature groups on a photolithographic mask depends on the various type(s) of IC(s) to be fabricated with the mask 110. The number is at least two and may go up to 20. Typically, M is in the range from three to eight.

It is now discussed how the features groups and their respective sub-areas 310 to 360 can be determined from the layout data. FIGS. 2 and 3 show that the overall area covered by absorber material $F_{m,C}'$ of the sub-area m ($1 \leq m \leq M$) is the sum of the areas individual absorbing pattern elements 210, 220, 230, 240, 250 or 260 within a sub-area 310, 320, 330, 340, 350 or 360:

$$F_{m,C}' = \sum_{k=1}^{K} F_{m,k}' \qquad (1)$$

wherein K is the total number of pattern elements in the sub-area m.

The ratio of the total area covered with pattern elements $F_{m,C}'$ and the total area $F_m'$ of the sub-area m determines the percentage of the optical transmission absorbed by the pattern elements. The normalized area $$F_m = \frac{F_{m,C}'}{F_m'} \qquad (2)$$

defines the percentage of the area of the sub-area m covered by pattern elements. $F_m$ determines the percentage an optical beam is attenuated when passing through the sub-area 310 to 360 of feature group 210 to 260. The variation of the optical beam transmission within a single sub-area 310 to 360 as a function of a variation of the areas of the respective pattern elements 210 to 260 depends on the size and the form of the individual pattern elements 210 to 260 in the respective feature group 310 to 360.

FIG. 4 shows an enlarged view of one of the pattern elements 210, 220, 230, 240, 250 or 260 with the number k in the sub-area m of FIG. 2 or 3. The target area of the pattern element k in the sub-area m is:

$$F_{m,k,Target}' = a_{m,k} \cdot b_{m,k} \qquad (3)$$

The examples of the pattern elements in FIGS. 1 to 3 have a rectangular form. Thus, equation (3) describes the target area of rectangular pattern elements. If any of the pattern elements 210, 220, 230, 240, 250, 260 does not have a rectangular form, equation (3) has to be expanded in order to describe the area of these pattern elements. To keep the subsequent considerations simple and illustrative, it is in the following assumed that all pattern elements K in all sub-areas M have a rectangular form.

For this case, the pattern circumference (PC) of the pattern element k in the sub-area m, which is the perimeter of the rectangle, is given by:

$$PC_{m,k} = 2 \cdot (a_{m,k} + b_{m,k}) \qquad (4)$$

The total pattern circumference (TPC) of the sub-area m is the sum of the PC or of the perimeter of all individual pattern elements K:

$$TPC_m = \sum_{k=1}^{K} PC_{m,k} \qquad (5)$$

By analyzing the ratio of the TPC and the total pattern area $F_{m,C}'$ of pattern arrangements in portions of the mask active area, groups of pattern elements can be identified having a specific ratio $$R_m = \frac{TPC_m}{F_{m,C}'} \qquad (6)$$

The parameter $R_m$ is specific for the pattern elements 210 to 260 in the sub-areas 310 to 316. A computer system can be used to analyze the geometrical layout data provided by the IC manufacturer to identify the sub-areas 310, 320, 330, 340, 350, and 360 of the mask 110. The splitting into the various FGs can be based on threshold levels for the parameter $R_m$.

For photolithographic masks, which are already in operation, layout data can also be used for the determination of the FG specific sub-areas 310 to 360. The identification of the FG specific sub-areas 310-360 is necessary for a regular or irregular check of the CDU development during operation of mask 110. Alternatively, the sub-areas 310-360 can be determined from optical transmission measurements using preferably a non-imaging metrology system as described above. It is also conceivable to apply an optical inspection system operating in the visible wavelength range for the determination of the FG specific sub-areas 310-360.

FIG. 4 shows a variation of the length $a_{m,k}$ and of the width $b_{m,k}$ of the pattern element k in the sub-area m by $\pm \Delta CD_m$. This offset results—besides the target area $F_{m,k,Target}'$ of equation (3)—in a second area for the feature element k in sub-area m:

$$F_{m,k,\pm CD} = (a_{m,k} \pm \Delta CD_m) \cdot (b_{m,k} \pm \Delta CD_m) \qquad (7)$$

The difference of the absorber covered areas of the pattern element k in the sub-area m when changing their dimensions by $\pm \Delta CD_m$ is given by:

$$\begin{aligned} \Delta F_{m,k}' &= F_{m,k,+\Delta CD}' - F_{m,k,-\Delta CD}' = \\ &= (a_{m,k} + \Delta CD_m) \cdot (b_{m,k} + \Delta CD_m) - \\ &\quad (a_{m,k} - \Delta CD_m) \cdot (b_{m,k} - \Delta CD_m) \\ &= 2 \cdot (a_{m,k} + b_{m,k}) \cdot \Delta CD_m \\ &= PC_{m,k} \cdot \Delta CD_m \end{aligned} \qquad (8)$$

wherein in the last step the pattern circumference (PC) of equation (4) has been used.

The total change of the absorber covered area $\Delta F_{m,C}'$ in the sub-area m due to a $\pm \Delta CD_m$ modification of each individual pattern element is the sum of the area variations of all individual pattern elements k in the sub-area m:

$$\Delta F_{m,C}' = \sum_{k=1}^{K} F_{m,k}' = \sum_{k=1}^{K} PC_{m,k} \cdot \Delta CD_m = TPC_m \cdot \Delta CD_m \qquad (9)$$

wherein equation (5) has been inserted.

In the following, the effect of a variation of the absorber covered area on the variation of the optical transmission is analyzed. As indicated in FIG. 1, the spot size 170 of the incident DUV optical beam 160 is large compared to area $F_{m,k}'$ of an individual pattern element 140. The transmission in the sub-area m at the position $(x_i, y_i)$ can be expressed by the equation:

$$T_m(x_i, y_i) = \frac{F'_{B,m,O}(x_i, y_i)}{F'_{B,m}} \quad (10)$$

$$= \frac{F'_{B,m} - F'_{B,m,C}(x_i, y_i)}{F'_{B,m}} =$$

$$= 1 - \frac{F'_{B,m,C}(x_i, y_i)}{F'_{B,m}}$$

wherein the transmission at the position $(x_i,y_i)$ of the grid node i is determined by the quotient of the open area $F'_{B,m,O}(x_i,y_i)$ for the incident beam and the overall beam area $F'_{B,m}$. As already mentioned, it is assumed that the sub-area 310-360 of each FG has a regular arrangement of pattern elements 210-260 and that all pattern elements in the sub-area m have an identical variation of their areas as given in equation (7). Therefore, equation (10) can be rewritten:

$$T_m(x_i, y_i) = \frac{F'_{m,O}(x_i, y_i)}{F'_m} = 1 - \frac{F'_{m,C}(x_i, y_i)}{F'_m} \quad (11)$$

wherein $F_m'$ denotes the total area of the sub-area m and $F_{m,O}'$ is the portion of the sub-area m which is not covered by absorbing pattern elements k ($F_m' = F_{m,C}' + F_{m,O}'$).

The mean transmission in the sub-area m, is determined by:

$$T_{m,Mean} = \frac{1}{N} \sum_{i=1}^{N} T_m(x_i, y_i) \quad (12)$$

A variation in the open area $\Delta F_{m,O}'$ in the sub-area m at the position $(x_i,y_i)$ by the CD variation offset of the dimensions of the pattern elements results in a variation of the transmission $\Delta T_m(x_i,y_i)$ according to equation (11):

$$\Delta T_m(x_i, y_i) = \frac{\Delta F'_{m,O}(x_i, y_i)}{F'_m} \quad (13)$$

$$= \Delta\left(1 - \frac{F'_{m,C}(x_i, y_i)}{F'_m}\right)$$

$$= -\frac{\Delta F'_{m,C}(x_i, y_i)}{F'_m} =$$

$$= -\frac{TPC_m \cdot \Delta CD_m(x_i, y_i)}{F'_m}$$

From equation (13) the CD variation within the sub-area m can be expressed as a function of the variation of the transmission:

$$\Delta CD_m(x_i, y_i) = -\frac{F'_{m,C}}{TPC_m} \cdot \Delta T_m(x_i, y_i) = \frac{\Delta T_m(x_i, y_i)}{C_m} \quad (14)$$

Thus, the proportionality constant $C_m$ in the sub-area m is given by the ratio of the total pattern circumference $TPC_m$ of all pattern elements k in the sub-area m and the overall area $F_m'$ of the sub-area m. The constant $C_m'$ is now normalized to the overall area $F_m'$ of the sub-area m according to:

$$C_m = -\frac{TPC_m}{F'_m} \quad (15)$$

Equation (14) can thus finally be written in the form:

$$\Delta CD_m(x_i, y_i) = \frac{\Delta T_m(x_i, y_i)}{C_m} \quad (16)$$

Since the variation of the optical transmission $\Delta T_m$ in the sub-area m is caused by a variation of the absorber covered area $\Delta F_{m,C}'$ produced by a variation of the dimensions of the pattern elements k in the sub-area m by the CD variation offset $\Delta CD_m$, the quotients of $$\frac{\Delta T}{\Delta CD_m} \text{ and } \frac{\Delta F_m}{\Delta CD_m}$$

are identical, wherein $\Delta F_m$ is the normalized area variation in the FG specific sub-area m according to:

$$\Delta F_m = \frac{\Delta F'_m}{F'_m} \quad (17)$$

Thus, the proportionality constant between the CD variation $\Delta CD_m$ in the sub-area m and of the transmission variation $\Delta T$ can also be determined from the quotient:

$$C_m = \frac{\Delta F_m}{\Delta CD_m} \quad (18)$$

Both, equations (15) and (18) determine the proportionality factor $C_m$ for each sub-area m directly from geometrical considerations of the layout data of the photomask 110.

In an alternative example, the proportionality constant $C_m$ is not directly fixed from geometrical layout data. Rather, a normalized energy flux $\Phi_{m,norm}$ is emulated from the layout data for each of the sub-areas m using an aerial image simulation. The aerial image simulator can be a two-dimensional (2D) or a three-dimensional (3D) simulator establishing a 2D or 3D image generated by the normalized energy flux in the wafer plane of the sub-areas 310-360 of the mask 110. The aerial image simulation uses the layout data provided by the IC manufacturer (for example gds or OASIS data).

Two simulations are performed. The first simulation uses a photomask 110 wherein the feature elements 210-260 in the sub-areas m have their target areas as given in equation (3). This simulation generates a distribution of the normalized energy flux $(\Phi)_{m,norm,target}(x_i,y_i)$ within sub-area m. For the second simulation the feature elements 210-260 in the sub-areas m are enlarged or diminished by a CD variation offset of their dimensions as given in equation (7). The second simulation generates a distribution of the normalized energy flux $\Phi_{m,norm,target,\pm\Delta CD}(x_i,y_i)$ within sub-area m. A deviation of the two simulated normalized energy fluxes are given by:

$$\Delta\Phi_{m,norm}(x_i,y_i) = \Delta\Phi_{m,norm,target,+\Delta CD}(x_i,y_i) - \Delta\Phi_{m,norm,target}(x_i,y_i) \quad (19)$$

or $$\Delta\Phi_{m,norm}(x_i,y_i) = \Delta\Phi_{m,norm,target}(x_i,y_i) - \Delta\Phi_{m,norm,target,-\Delta CD}(x_i,y_i) \quad (20)$$

From equations (19) or (20) the averaged variation of $\Delta\Phi_{m,norm}(x_i,y_i)$ is determined according to:

$$\Delta\Phi_{m,norm} = \frac{1}{N}\sum_{i=1}^{N}\Delta\Phi_{m,norm}(x_i, y_i) \quad (21)$$

The averaged variation of $\Delta\Phi_{m,norm}$ is caused by the variation of the pattern covered area as given in equation (9). Thus, the sub-area specific constant $C_m$ for sub-area m between the transmission variation (induced by a CD variation offset of the feature elements) and the CD variation offset is determined by the quotient:

$$C_m = \frac{\Delta\Phi_{m,norm}}{\Delta CD_m} \quad (22)$$

After having determined the proportionality factor $C_m$ between the transmission variation $\Delta T_m$ in a sub-area m and the respective CD variation $\Delta CD_m$, the process of determining the CD variation across the photomask 110 is now described. FIG. 5 illustrates six sub-areas 510, 520, 530, 540, 550, and 560 identified from the pattern arrangements 210-260 of FIG. 2. In the sub-areas 510-560 the optical transmission is measured at the grid nodes $(x_i,y_i)$ indicated by the dots (shown in FIG. 6) in the respective sub-area. Other arrangements of the transmission measurement positions are also possible. The number of measurement positions within a sub-area 510-560 depends on the size of the respective area and structure of the feature elements 210-260 of the respective sub-area. Typically the number of grid nodes for a sub-area m is in the range from 100 to 10000.

The measurements are performed with one of the metrology tools discussed in the context of FIG. 1. As the transmission measurement at a single position can be executed in less than one second, the experimental transmission data for the overall mask 110 can be obtained in less than one hour.

The imaging metrology tool can detect transmission variations between successive measurements in the range of about 1%. By averaging the transmission measurements of the numerous grid nodes $(x_i,y_i)$ within a sub-area, the resolution for the determination constant $C_m$ can be enhanced to less than 0.1%.

Due to the high signal-to-noise (SNR) ration of a non-imaging tool, its inherent resolution is typically < 0.1%. On the other hand, as already mentioned above, the non-imaging tool determines the CD variation of the photomask 110, whereas the imaging tool identifies all relevant contributions to the CD variation on the wafer.

FIG. 7 schematically represents the measured distributions of the optical transmission 710, 720, 730, 740, 750, and 760 of the sub-areas 510-560 of FIG. 5. FIG. 7 indicates that the transmission values of the various FG specific sub-areas 510 to 560 span a significant range of transmission levels mainly depending on the radio of the area covered by pattern elements $F_{m,C}{}'$ and the overall area $F_m{}'$ of the sub-area m. Moreover, the individual transmission distributions 710 to 760 of each sub-area 510 to 560 also show a variation specific for each sub-area which is schematically indicated in FIG. 7 by a respective tilt of the transmission distribution 710 to 760.

As already described during the discussion of FIG. 4, the CD variation $\Delta CD_m$ is proportional to the variation of the transmission $\Delta T_m$ within the respective FB specific sub-area m. Equation (12) describes the calculation of an average or a mean value of the optical transmission $T_{m,Mean}$ for each sub-area m from the measured transmission data.

The variation of the optical transmission within each sub-area m is defined as the local deviation of the transmission $\Delta T_m(x_i,y_i)$ from the mean transmission value according to:

$$\Delta T_m(x_i,y_i) = T_m(x_i,y_i) - T_{m,Mean} \quad (23)$$

FIG. 8 schematically shows the variations of the optical transmission 810, 820, 830, 840, 850, and 860 of the FG specific sub-areas 510-560. $\Delta T_m(x_i,y_i)$ shows a variation which is symmetrically around zero. As analysed during the discussion of FIG. 4, the variation range of each sub-area 510 to 560 depends of the kind of the feature element(s) contained in the respective sub-area. This means that the kind of the feature element(s) within a FG specific sub-area m strongly influences the conversion of a CD variation $\Delta CD(x_i,y_i)$ of the feature elements into a measured optical transmission variation $\Delta T_m(x_i,y_i)$.

The various conversion of an identical CD variation to different the measured optical transmission variations caused by the kind of the specific feature element(s) in the respective sub-area m can be corrected with a feature group specific proportionality constant given in equations (15), (18) or (21). This is schematically illustrated in FIG. 9 which shows the CD variations $\Delta CD(x_i,y_i)$ within the sub-areas 210 to 260 as obtained from optical transmission measurements and corrected by the FG specific proportionality constant $C_m$.

As indicated by the reference numbers 570 and 580 in FIG. 5, some of the portions the active mask area are not covered by one of the FG specific sub-areas 510 to 560 and thus according to FIG. 6 the optical transmission is not measured for these portions 570 and 580 of the active areas of the photomask 110. Therefore, the method defined above does not determine a CD variation for the portions 570 and 580.

On the other hand, in order to gain an overview of the CD variation across the overall mask 110, it is desirable to have a CDU distribution for the complete active mask area. In case the portion 570 not covered by one of the FG specific sub-areas has two or more adjacent sub-areas 510, 520, 530, 540, 550 or 560, a CD variation for the portion 570 can be determined by interpolating the CD variation of the adjacent sub-areas 510, 520, 530, 540, 550 or 560. For the interpolation the known algorithms can be used. In particular, a linear interpolation between the CD variations of the at least two adjacent sub-areas can be applied.

Further, in the boundary range 580 of the photomask there may be portions of the uncovered active area which have only one adjacent FG specific sub-area. In order to cover the portion(s) 580 the CD variation of the sub-area of the next feature group can be extrapolated to also cover the portion(s) 580. Moreover, a combination of interpolation and extrapolation can also be applied for the portions 570 and 580.

The described method for the determination of the CD variation does not require complex measurements as for example by using a SEM or an AFM in order to determine the proportionality constant $C_m$. Thus, the described method allows the determination of the CDU distribution across the active area of a photolithographic mask 110 without the need to prepare and to measure a test sample of the mask 110 using a SEM or an AFM. The CDU distribution across the active area of the photolithographic mask 110 can be determined by measuring the optical transmission at various locations across the mask.

In some implementations, a femtosecond laser system can be provided to locally modify an optical density of the photolithographic mask substrate in order to correct the determined critical dimension variation.

The features described above related to processing of data, e.g., according to one or more of equations (1) to (23), can be implemented in digital electronic circuitry, or in a computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. For example, an evaluation device may include one or more such processors that execute instructions for implementing a process for determining the positions of structures on a lithography mask. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a LCD (liquid crystal display) monitor, an electronic ink (E-ink) display, or an organic light emitting diode (OLED) display for displaying information to the user and a keyboard and a pointing device such as a mouse, a trackball, or touchpad by which the user can provide input to the computer. A touch display can also be used in which the display surface is sensitive to touch inputs from a user.

A number of implementations have been described. Nevertheless, it will be understood that various modifications may be made. For example, the metrology tool may include a detector system for detecting the electromagnetic radiation of the light source and an optical system to direct the electromagnetic radiation from the source through the photolithographic mask to the detector system. The metrology tool may measure a distribution of the transmission of each sub-area. For example, elements of one or more implementations may be combined, deleted, modified, or supplemented to form further implementations. As yet another example, the logic flows of processes described above do not require the particular order shown, or sequential order, to achieve desirable results. In addition, other steps may be provided, or steps may be eliminated, from the described flows, and other components may be added to, or removed from, the described systems.

Accordingly, other implementations are within the scope of the following claims.

The invention claimed is:

1. A computer-implemented method for determining a critical dimension variation of a photolithographic mask and correcting the determined critical dimension variation, the method comprising:
   a. using layout data of the photolithographic mask to determine at least two sub-areas of the photolithographic mask, each sub-area comprising a group of features;
   b. measuring a distribution of a transmission of each sub-area, including measuring the transmission at a plurality of grid nodes of each sub-area;
   c. determining a deviation of the transmission at each of at least some of the grid nodes from a mean transmission value for each sub-area, in which the mean transmission value is determined based on the transmission at the plurality of grid nodes of the sub-area;
   d. determining, by a data processor, a constant specific for each sub-area;
   e. determining, by the data processor, the critical dimension variation of the photolithographic mask by combining for each sub-area the deviation of the transmission at each of at least some of the grid nodes and the sub-area specific constant; and
   f. generating, by the data processor, an output having information about the critical dimension variation of the photolithographic mask; and
   g. correcting the determined critical dimension variation by locally modifying an optical density of a photolithographic mask substrate.

2. The method according to claim 1, wherein determining the sub-area of a feature group comprises searching for features in the layout data having a similar ratio of a total pattern circumference and a total pattern area, wherein the total pattern circumference is the sum of the circumferences of all pattern elements in a portion of the photolithographic mask and the total pattern area is the sum of all areas of all pattern elements in the portion of the photolithographic mask.

3. The method according to claim 1, wherein a distribution of the transmission of each sub-area comprises measuring the transmission at N grid nodes of each of M sub-areas.

4. The method according to claim 1, wherein determining the deviation of the transmission from a mean transmission value comprises defining a mean transmission in the sub-area m according to:

$$T_{m,Mean} = \frac{1}{N} \cdot \sum_{i=1}^{N} T_m(x_i, y_i)$$

and a deviation from the mean transmission value $\Delta T_m(x_i,y_i)$ according to:

$$\Delta T_m(x_i,y_i) = T_m(x_i,y_i) - T_{m,Mean}.$$

5. The method according to claim 1, wherein determining the constant comprises analyzing of the layout data.

6. The method according to claim 5, wherein the simulation process comprises an aerial image simulation, in particular a two-dimensional aerial image simulation and/or a three dimensional aerial image simulation.

7. The method according to claim 6, further comprising applying a critical dimension variation offset $\Delta CD$ to all feature elements of the layout data and determining a normalized energy flux for the sub-area m $\Phi_{m,norm}$ for the feature elements having a target dimension $CD_{Target}$ and for the feature elements after applying the critical dimension variation offset $CD_{Target}+\Delta CD$ or $CD_{Target}-\Delta CD$ using the aerial image simulation.

8. The method according to claim 7, further comprising determining the constant $C_m$ in the sub-area m as a quotient of the normalized energy flux variation $\Delta\Phi_{m,norm}$ and the critical dimension variation $\Delta CD$ according to:

$$C_m = \frac{\Delta\Phi_{m,norm}}{\Delta CD}$$

wherein the normalized energy flux variation is given by $$\Delta\Phi_{m,norm} = \Phi_{m,norm}(CD_{Target}+\Delta CD) - \Phi_{m,norm}(CD_{Target})$$

or $$\Delta\Phi_{m,norm} = \Phi_{m,norm}(CD_{Target}) - \Phi_{m,norm}(CD_{Target}-\Delta CD).$$

9. The method according to claim 5, wherein analysing the layout data comprises determining absorber covered areas for all pattern elements of the sub-area m, $F_{m,C}'$, and determining absorber covered areas $F_{m,C,+\Delta CD}'$ or $F_{m,C,-\Delta CD}'$ for all pattern elements after applying the critical dimension variation offset $CD_{Target}+\Delta CD$ or $CD_{Target}-\Delta CD$, and determining the variation of a normalized absorber covered area $\Delta F_{m,C}$ in the sub-area m according to:

$$\Delta F_{m,C} = \frac{F_{m,C,+\Delta CD}' - F_{m,C}'}{F_m'}, \text{ or } \Delta F_{m,C} = \frac{F_{m,C}' - F_{m,C,-\Delta CD}'}{F_m'}$$

wherein $F_m'$ is the overall sub-area m.

10. The method according to claim 9, further comprising determining the constant $C_m$ of the sub-area m as the quotient of the absorber covered normalized area variation $\Delta F_{m,C}$ and the critical dimension variation $\Delta CD$ according to:

$$C_m = \frac{\Delta F_{m,C}}{\Delta CD}.$$

11. The method according to claim 5, wherein analysing the layout data comprises determining the total pattern circumference $TPC_m$ or all pattern elements in the sub-area m and determining the absorber covered area $F_{m,C}'$ for the sub-area m.

12. The method according to claim 11, further comprising determining the constant $C_m$ in the sub-area m as the quotient of the normalized absorber covered area $F_{m,C}$ and the total pattern circumference $TPC_m$ according to:

$$C_m = \frac{F_{m,C}}{TPC_m},$$

wherein the normalized absorber covered area of sub-area $F_{m,C}$ is given by $$F_{m,C} = \frac{F_{m,C}'}{F_m'}.$$

13. The method according to claim 8, wherein determining the critical dimension variation $\Delta CD_m(x_i,y_i)$ in the sub-area m comprises forming a quotient of the deviation of the transmission $\Delta T_m(x_i,y_i)$ and of the constant $C_m$ according to:

$$\Delta CD_m(x_i, y_i) = \frac{\Delta T_m(x_i, y_i)}{C_m}.$$

14. The method according to claim 1, further comprising determining a critical dimension variation across the photolithographic mask by interpolating the critical dimension variation for areas of the photolithographic mask not covered by sub-areas.

15. The method according to claim 1, further comprising determining a critical dimension variation across the photolithographic mask by extrapolating the critical dimension variation for areas of the photolithographic mask not covered by sub-areas.

16. An apparatus for determining a critical dimension variation of a photolithographic mask and correcting the determined critical dimension variation, the apparatus comprising:
   a. a computer system operable to determine at least two sub-areas of the photolithographic mask from layout data, each sub-area comprising a group of features, operable to determine, for each sub-area, a deviation of a transmission at each of at least some of a plurality of grid nodes of the sub-area from a mean transmission value for the sub-area, in which the mean transmission value is determined based on the transmission at the plurality of grid nodes of the sub-area, operable to determine a constant specific for each sub-area from the layout data, and operable to determine the critical dimension variation of the photolithographic mask by combining for each sub-area the deviation of the transmission at each of at least some of the grid nodes and the sub-area specific constant;

b. a metrology tool comprising a source of electromagnetic radiation, a detector system for detecting the electromagnetic radiation of the source and optical means to direct the electromagnetic radiation from the source through the photolithographic mask to the detector system and operable to measure a distribution of the transmission of each sub-area, in which measuring the distribution of the transmission of each sub-area includes measuring the transmission at a plurality of grid nodes of each sub-area; and c. a femtosecond laser system operable to locally modify an optical density of a photolithographic mask substrate in order to correct the determined critical dimension variation.

17. The apparatus according to claim 16, wherein the computer system is further operable to determine the sub-area of a feature group by searching for features in the layout data having a similar ratio of a total pattern circumference and a total pattern area, wherein the total pattern circumference is the sum of the circumferences of all pattern elements in a portion of the photolithographic mask and the total pattern area is the sum of all areas of all pattern elements in the portion of the photolithographic mask.

18. The apparatus according to claim 16, wherein the metrology tool is further operable to measure the transmission at N grid nodes of each of M sub-areas and the computer system is further operable to determine a distribution of the transmission of each sub-area.

19. The apparatus according to claim 16, wherein the computer system is further operable to perform a simulation process in order to determine the constant.

20. The apparatus according to claim 19, wherein the simulation process comprises an aerial image simulation, in particular a two-dimensional aerial image simulation and/or a three dimensional aerial image simulation.

21. The apparatus according to claim 16, wherein the computer system is operable to analyze layout data in order to determine the constant.

22. The method of claim 1 in which determining the constant used for determining the critical dimension variation of the photolithographic mask comprises performing a simulation process using the layout data.

23. The method of claim 1 in which determining the critical dimension variation of the photolithographic mask comprises determining the critical dimension variation of the photolithographic mask at each of at least some of the grid nodes of each sub-area by combining for each sub-area the deviation of the transmission at each of at least some of the grid nodes and the sub-area specific constant.

24. The method of claim 1 in which generating the output comprises generating an output having information about the critical dimension variation of the photolithographic mask at each of at least some of the grid nodes of each sub-area.

* * * * *

UNITED STATES PATENT AND TRADEMARK OFFICE
CERTIFICATE OF CORRECTION

PATENT NO. : 10,157,804 B2
APPLICATION NO. : 14/232097
DATED : December 18, 2018
INVENTOR(S) : Rainer Pforr Page 1 of 2

It is certified that error appears in the above-identified patent and that said Letters Patent is hereby corrected as shown below:

In the Specification

Column 6
Line 53, delete "m,$F_{m,C}$'" and insert -- $m, F"_{m,C}$ --
Line 54, delete "$F_{m,C,+\Delta CD}$' or $F_{m,C,-\Delta CD}$'" and insert -- $F"_{m,C,+\Delta CD}$ or $F"_{m,C,-\Delta CD}$ --
Line 65, delete "$F_m$'" and insert -- $F"_m$ --

Column 7
Line 19, delete "$F_{m,C}$'" and insert -- $F"_{m,C}$ --

Column 11
Line 6, delete "$F_{m,C}$'" and insert -- $F"_{m,C}$ --
Line 20, delete "$F_{m,C}$' and the total area $F_m$'" and insert -- $F"_{m,C}$ and the total area $F"_m$ --
Line 43 (approx.), delete "$F_{m,k,Target}$'=" and insert -- $F"_{m,k,Target}$ = --
Line 67, delete "$F_{m,C}$'" and insert -- $F"_{m,C}$ --

Column 12
Line 30, delete "$F_{m,k,Target}$'" and insert -- $F"_{m,k,Target}$ --
Line 50, delete "$\Delta F_{m,C}$'" and insert -- $\Delta F"_{m,C}$ --
Line 65, delete "$F_{m,\kappa}$'" and insert -- $F"_{m,k}$ --

Column 13
Line 12 (Approx.), "$F_{B,m,O}$'" and insert -- $F"_{B,m,O}$ --
Line 13 (Approx.), delete "$F_{B,m}$'" and insert -- $F"_{B,m}$ --
Line 25, delete "$F_m$'" and insert -- $F"_m$ --
Line 26, delete "$F_{m,O}$'" and insert -- $F"_{m,O}$ --
Line 27, delete "($F_m$'=$F_{m,C}$'+$F_{m,O}$')" and insert -- ($F"_m = F"_{m,C} + F"_{m,O}$) --
Line 37 (Approx.), delete "$\Delta F_{m,O}$'" and insert -- $\Delta F"_{m,O}$ --
Line 66, delete "$F_m$' of the sub-area m. The constant $C_m$'" and insert -- $F"_m$ of the sub-area $m$. The constant $C"_m$ --

Signed and Sealed this
Thirtieth Day of July, 2019

Andrei Iancu
*Director of the United States Patent and Trademark Office*

Line 67, delete "$F_m$'" and insert -- $F"_m$ --

Column 14
Line 14, delete "$\Delta F_{m,C}$'" and insert -- $\Delta F"_{m,C}$ --

Column 15
Line 65, delete "$F_{m,C}$' and the overall area $F_m$'" and insert -- $F"_{m,C}$ and the overall area $F"_m$ --

In the Claims

Column 19
Line 39, in Claim 8, delete "ACD" and insert -- $\varDelta CD$ --
Line 55 (Approx.), in Claim 9, delete "$F_{m,C}$'" and insert -- $F"_{m,C}$ --
Line 56 (Approx.), in Claim 9, ",$F_{m,C,+\Delta CD}$' or $F_{m,C,-\Delta CD}$'" and insert -- $F"_{m,C,+\varDelta CD}$ or $F"_{m,C,-\varDelta CD}$ --
Line 67, in Claim 9, delete "$F_m$'" and insert -- $F"_m$ --

Column 20
Line 15 (Approx.), in Claim 11, delete "$F_{m,C}$'" and insert -- $F"_{m,C}$ --